US006693573B1

(12) United States Patent
Linder

(10) Patent No.: US 6,693,573 B1
(45) Date of Patent: Feb. 17, 2004

(54) MIXED TECHNOLOGY MEMS/BICMOS LC BANDPASS SIGMA-DELTA FOR DIRECT RF SAMPLING

(75) Inventor: Lloyd Linder, Agoura Hills, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 10/391,991

(22) Filed: Mar. 19, 2003

(51) Int. Cl.⁷ .................................................. H03M 3/00
(52) U.S. Cl. ........................................................ 341/143
(58) Field of Search ................................ 341/143, 133, 341/136

(56) References Cited

U.S. PATENT DOCUMENTS 6,538,588 B1 * 3/2003 Bazarjani .................... 341/143

* cited by examiner

*Primary Examiner*—Brian Young
(74) *Attorney, Agent, or Firm*—Leonard A. Alkov; Glenn H. Lenzen, Jr.

(57) ABSTRACT

An improved sigma-delta modulator is disclosed. The sigma-delta modulator utilizes Micro Electro Mechanical System (MEMS) technology coupled with on-chip LC networks. MEMS switches are used to switch capacitors and inductors in and out of the network to alter the center frequency and tuning range of the sigma-delta modulator, thus eliminating active components in each LC network. Furthermore, the use of MEMS switches improves the Q of each LC network relative to previous on-chip sigma-delta modulator designs. The increased Q of each LC network reduces or eliminates the need for active Q-enhancement circuitry and improves the inherent filter shape within the loop of the sigma-delta modulator. In addition, the distortion of active components with the loop of the sigma-delta modulator also is improved. The addition of a decimator to the chip presents a complete single chip LC sigma-delta analog-to-digital converter.

27 Claims, 3 Drawing Sheets

MIXED TECHNOLOGY MEMS/BICMOS LC BANDPASS SIGMA-DELTA FOR DIRECT RF SAMPLING

FIELD OF THE INVENTION

The present invention relates to sigma-delta modulators and, more particularly, to a single chip sigma-delta modulator utilizing micro electromechanical system (MEMS) technology and BiCMOS technology to provide a flexible, low power modulator.

BACKGROUND OF THE INVENTION

There are two basic techniques for performing analog-to-digital conversion. An analog-to-digital converter (ADC) using the first technique, known as the Nyquist rate technique, generates a digital signal directly in response to an analog input signal. The Nyquist rate ADC samples the analog input signal at twice the frequency (known as the Nyquist frequency) of the highest expected frequency component of the input signal. The Nyquist rate ADC uses a series of precisely-matched components to digitize the input signal. The resolution and accuracy of the Nyquist rate ADC depend on the matching of these components. However, highly-precise components are difficult to achieve in conventional integrated circuit processing.

An ADC using the second technique, known as the sigma-delta technique, represents the analog input signal by generating a stream of digital samples whose pulse density is a measure of the voltage at the ADC input. The sigma-delta ADC includes a sigma-delta modulator and a decimator. The modulator includes a quantizer which generates a digital output signal in response to a filtered difference between the analog input signal and a feedback signal. The feedback signal is the digital output signal reconverted to an analog signal in a digital-to-analog converter (DAC). The modulator is oversampled, meaning that the sampling rate is above the Nyquist rate. The decimator resamples the output of the modulator and provides an N-bit data word at the Nyquist rate. The sigma-delta technique achieves high resolution by precise timing instead of by precisely-matched components (resistors and capacitors) which are required by the Nyquist rate ADC.

A simple sigma-delta ADC uses a first-order modulator with a single integrator performing the filter function, a one-bit quantizer, and a one-bit DAC. Since the quantizer can provide the output of the modulator at only one of two levels, its operation is necessarily linear. The first-order sigma-delta modulator has high quantization noise at the sampling frequency. The action of the filter in the modulator shapes the quantization noise to be higher at higher frequencies. Thus, the converter is referred to as a noise-shaping ADC. The decimator also includes a filter having a lowpass characteristic with a cutoff frequency at the Nyquist frequency. Since the sampling frequency is much higher than the Nyquist frequency, the filter can usually attenuate this out-of-band quantization noise sufficiently.

A second-order ADC having two filters in the modulator loop has higher out-of-band quantization noise but lower in-band noise than the first-order ADC. Thus, if the out-of-band noise can be sufficiently filtered, the second-order sigma-delta modulator has better performance. The necessary attenuation can be achieved if the decimation filter is one order greater than the order of the modulator. Further performance increases can be achieved using higher order modulators, although higher order modulators tend to be more difficult to stabilize.

Typically, sigma-delta modulators are implemented by designing the integrator either in the discrete-time domain (e.g., using switched-capacitor filters) or in the continuous-time domain (e.g., using RC, transconductor-C, and LC filters). A drawback of discrete-time modulators is that they are generally slower than their continuous-time counterparts. Continuous-time modulators, on the other hand, typically are implemented with off chip inductors, although designs have been attempted using on-chip inductors. The on-chip inductor designs, however, suffer from the limitations of the available Q for on-chip inductors in silicon and require active Q-enhancement circuits, which introduce noise and distortion. The on-chip inductors also have a limited frequency range, for a given inductance value, over which there is any significant Q value. In addition, center frequency tuning is accomplished using active circuitry, which resultantly degrades the overall thermal noise floor of the modulator as the center frequency is adjusted. Furthermore, such designs lack flexibility (e.g., the ability to dynamically adjust the modulator's characteristics) at radio frequencies and thus do not include wideband frequency-hopping capabilities.

Accordingly, there is a need the art for a single chip sigma-delta modulator that can dynamically adjust its characteristics to provide frequency hopping capability in the radio frequency (RF) band. Additionally, it would be advantageous to provide a sigma-delta modulator that has a reduced number of active Q-enhancement circuits, and have an inductance value that has a high Q capability over a wide bandwidth.

SUMMARY OF THE INVENTION

In the light of the foregoing, the invention relates to a sigma-delta modulator that includes a substrate; at least one transconductance amplifier on the substrate; at least one digital-to-analog converter (DAC) on the substrate; a plurality of micro electro mechanical system (MEMS) switches on the substrate; and at least one LC network on the substrate, wherein a center frequency of the modulator is modified using at least one of the plurality MEMS switches.

Another aspect of the invention relates to a sigma-delta modulator that includes a substrate; at least one transconductance amplifier on the substrate; at least one digital-to-analog converter (DAC) on the substrate; at least one LC network on the substrate; and at least one MEMS variable capacitor on the substrate, wherein a center frequency of the sigma-delta modulator is modified by varying the capacitance of the at least one MEMS variable capacitor.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DESCRIPTION OF THE INVENTION

Figure 1:
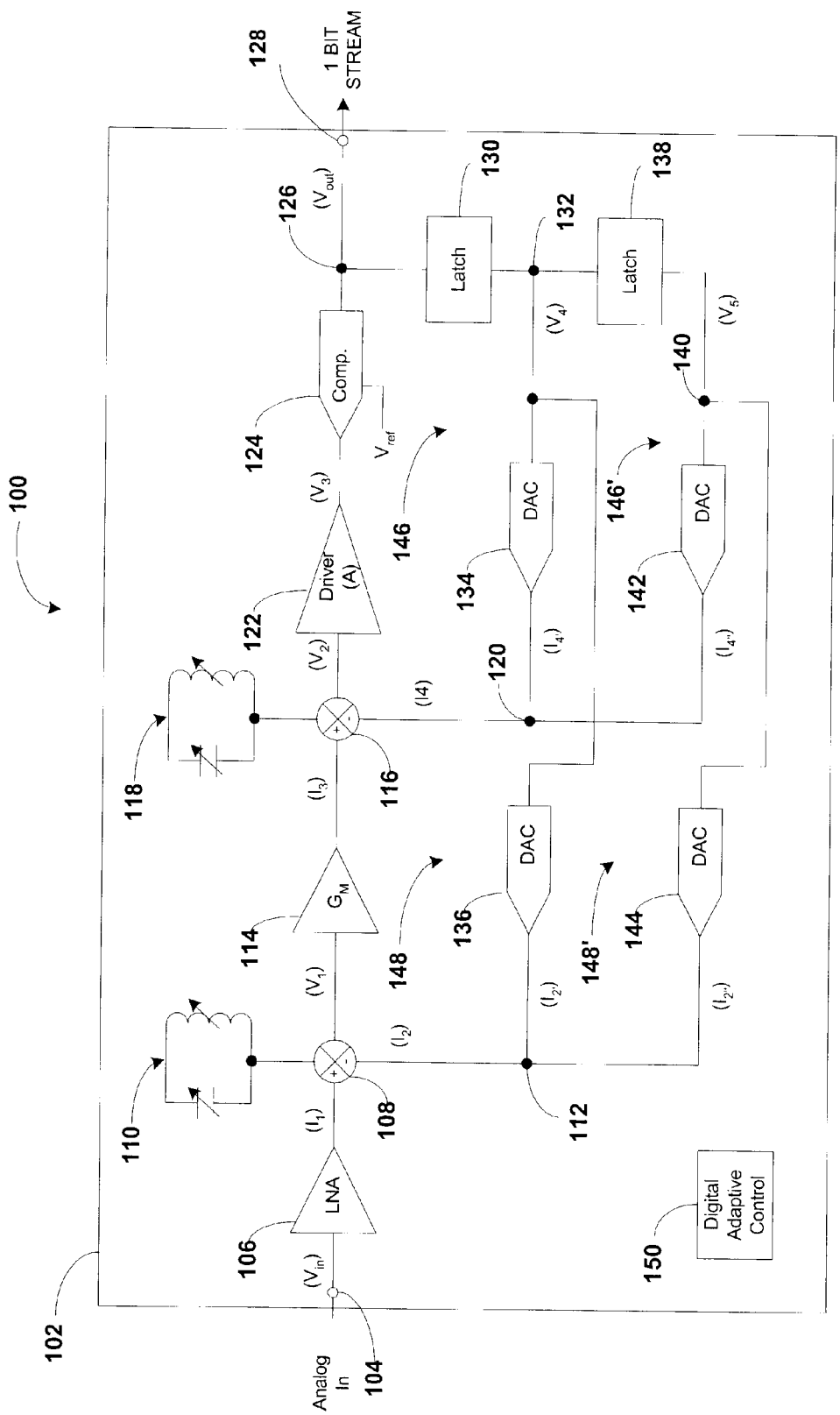
FIG. 1 is a block diagram of a sigma-delta modulator in accordance with an embodiment of the invention.

The following is a detailed description of the present invention with reference to the attached drawings, wherein like reference numerals will refer to like elements throughout.

Referring to FIG. 1, a fourth order sigma-delta modulator 100 in accordance with an embodiment of the present invention is illustrated. It is noted that the fourth order modulator 100 it is merely exemplary and higher or lower order modulators may be implemented without departing from the scope of the present invention. Furthermore, for the sake of clarity, various components and circuitry (e.g., clock signals and power connections) are not shown in the modulator 100. The implementation of such components and circuitry, however, would be obvious to one skilled in the art based on the disclosure herein.

The sigma-delta modulator 100 is implemented on a semiconductor substrate 102, such as, for example, a silicon-germanium (SiGe) substrate. An input terminal 104 receives analog signals for conversion by the sigma-delta modulator 100 to digital form. For example, an antenna or antenna array (not shown) for receiving a composite radio signal may be connected to the input terminal 104. The input terminal 104 is electrically connected to a low noise amplifier (LNA) 106 on the substrate. The LNA 106 is a transconductance amplifier and converts a voltage at the input terminal 104 to a current, which is provided to a first summing junction 108.

The first summing junction 108 also is electrically connected to a first resonant LC network 110 and to a first node 112. The first resonant LC network 110 will be discussed in more detail below. An output of the first summing junction 108 is electrically connected to an input of a transconductance amplifier 114. The transconductance amplifier converts a voltage generated at the resonant LC network 110 to a current, which is provided to a second summing junction 116.

The second summing junction 116 is electrically connected to a second resonant LC network 118 and to a second node 120. An output of the second summing junction 116 is electrically connected to the input of a driver amplifier 122. The output of the driver amplifier 122 is electrically connected to an input of a comparator 124, and the output of the comparator 124 is electrically connected to a third node 126. The comparator 124 compares the output from the driver amplifier 122 to a preset voltage and produces a 1-bit stream of data, which is provided to an output terminal 128 via the third node 126. The third node 126 also is electrically connected to an input of a first latch 130. An output of the first latch 130 is electrically connected to a fourth node 132.

The fourth node 132 is electrically connected to the input of a first digital-to-analog converter (DAC) 134, the input of a second DAC 136, and to the input of a second latch 138. The output of the first DAC is electrically connected to the second node 120, and the output of the second DAC 136 is electrically connected to the first node 112.

The output of the second latch 138 is electrically connected to a fifth node 140. The fifth node 140 is electrically connected to the input of a third DAC 142 and to the input of a fourth DAC 144. The output of the third DAC 142 is electrically connected to the second node 120, and the output of the fourth DAC 144 is electrically connected to the first node 112. A first feedback loop 146 is formed by the first latch 130 and the first DAC 134. A second feedback loop 148 is formed by the first latch 130 and the second DAC 136. A third feedback loop 146' is formed by the first latch 130, the second latch 138 and the third DAC 142. A fourth feedback loop 148' is formed by the first latch 130, the second latch 138 and the fourth DAC 144.

The sigma-delta modulator 100 preferably employs mixed technology, including Micro Electro Mechanical System (MEMS) technology and, for example, BiCMOS technology on a single substrate 102. In particular, the resonant LC networks 110, 118 are implemented using MEMS technology, while the LNA 106, the transconductance amplifier 114, the driver amplifier 122, the comparator 122, the latches 130, 138 and the DACs 134, 136, 142, 144 may be implemented using SiGe BiCMOS technology, for example. The benefits of a mixed technology approach include a reduction in size and in power consumption, noise, and distortion of the sigma-delta modulator 100. Size reduction is a result of the integration of many different functions onto a single chip. Power savings results from use of a power efficient SiGe BiCMOS process, the reduction and/or elimination of active Q-enhancement circuitry, and MEMS technology. This is a result of the fact that the Q of the resonant MEMS LC network will be much higher than that achievable with an on-chip LC network.

The operation of the sigma-delta modulator 100 now will be briefly discussed. With continued reference to FIG. 1, an analog signal, such as, for example, a radio frequency (RF) signal, enters the sigma-delta modulator 100 at the input terminal 104. The RF signal is conditioned by the LNA 106 and provides a gain adjusted analog signal as an output in response thereto. As mentioned above, the LNA 106 is a transconductance amplifier and converts the voltage signal ($V_{in}$) applied to the input of the LNA 106 to a current signal ($I_1$), which is provided at the output of the LNA. In one embodiment, the LNA performs a single ended to differential conversion, which allows the modulator 100 to be fully differential, thus providing good power supply rejection, common mode rejection, and the cancellation of second order products. The output of the LNA 106 is provided to the positive input of the first summing junction 108. The negative input of the first summing junction 108 is provided a current signal ($I_2$) from the second DAC 136 and the fourth DAC 144. The second DAC 136 and the fourth DAC 144 will be discussed in more detail below. The first summing junction 108 sums the two signals (one positive and one negative) and provides the resultant signal to the first resonant LC network 110.

As will be described in more detail below, the first resonant LC network 110 includes variable capacitive and inductive components, which provide the ability to adjust the center frequency and tuning range of the modulator 100. The first resonant LC network 110 converts the current signal summed at the first summing junction 108 into a voltage signal ($V_1$), which is provided to the transconductance amplifier 114. The transconductance amplifier 114 converts the voltage signal back to a current signal ($I_3$) (the transfer function is $I=G_M*V$, were "I" is the output current, "$G_M$" is the gain of the amplifier 114, and "V" is the voltage at the input of the amplifier 114). The current signal from the transconductance amplifier 114 is provided to the positive input of a second summing junction 116. The negative input of the second summing junction 116 is provided a current signal (I$_4$) from the first DAC 134 and the third DAC 142. The first DAC 134 and the third DAC 142 will be discussed in more detail below. The second summing junction sums the two signals (one positive, one negative) and provides the resultant signal to the second resonant LC network 118.

Similar to the first resonant LC network 110, the second resonant LC network 118 also includes variable capacitive and inductive components. The second resonant LC network 118 converts the current signal summed at the second summing junction 116 into a voltage signal (V$_2$), which is provided to the input of the driver amplifier 122. The driver amplifier 122 effectively is a buffer amplifier that has a predetermined gain "A" and facilitates scaling of the voltage signal provided to the comparator 124. The comparator 124 compares the voltage level of the filtered and gain adjusted analog signal (V$_3$) from the driver amplifier 122 with a predetermined reference voltage (V$_{ref}$) at predetermined time intervals. The predetermined time intervals are determined by the rate at which the comparator 124 is clocked. The comparator 124 outputs a 1-bit digital signal (V$_{out}$) (e.g., a 1 bit quantizer) to the output terminal 128 of the modulator 100. The 1-bit digital stream represents a reference threshold that corresponds to the analog signal (V$_{in}$) at a predetermined time interval. The voltage output of the comparator 124 also is provided to the input of a first latch 130.

The output of the first latch 130 is a voltage signal (V$_4$) that is provided to the first DAC 134, the second DAC 136 and the second latch 138. The first latch 130 introduces a one cycle delay to properly setup the data for the first and second feedback DACs 134, 136. The first DAC 134 converts the voltage signal from the first latch 130 to a "switched" current signal (I$_4$), which is provided to the second node 120. Similarly, the second DAC 136 converts the voltage signal from the first latch 130 to a switched current signal (I$_2$), which is provided to the first node 112.

The second latch 138 re-latches the voltage output of the comparator 124 to provide a latched voltage (V$_5$) before the third and fourth DACs 142, 144 are driven, and introduces an additional half-cycle delay (1.5 cycles total) in the comparator feedback path that is compensated for by the third and fourth DACs 142, 144. An effect of the second latch 138 is that it eliminates signal dependent jitter delay. Additional details relating to first and second latch 130, 138 and their use in a sigma-delta modulator can be found in U.S. Pat. No. 6,414,615, the disclosure of which is herein incorporated by reference in its entirety.

The third DAC 142 converts the voltage signal from the second latch 138 to a switched current signal (I$_{4''}$), which is provided to the second node 120. Similarly, the fourth DAC 144 converts the voltage signal from the second latch 138 to a switched current signal (I$_{2''}$), which is provided to the first node 112. Feedback pulse shaping gains for each DAC 134, 136, 142, 144 are adjusted by tuning the DAC switching currents to achieve a good noise shaping behavior and to provide partial compensation of time domain non-idealities.

The current output of the first DAC 134 (I$_{4'}$) and the current output of he third DAC 142 (I$_{4''}$) are summed at the second node 120 to produce a feedback current (I$_4$), which is provided to the negative input of the second summing junction 116. Similarly, the current output of the second DAC 136 (I$_{2'}$) and the current output of the fourth DAC 144 (I$_{2''}$) are summed at the first node 112 to produce a feedback current (I$_2$), which is provided to the negative input of the first summing junction 108.

Figure 2A:
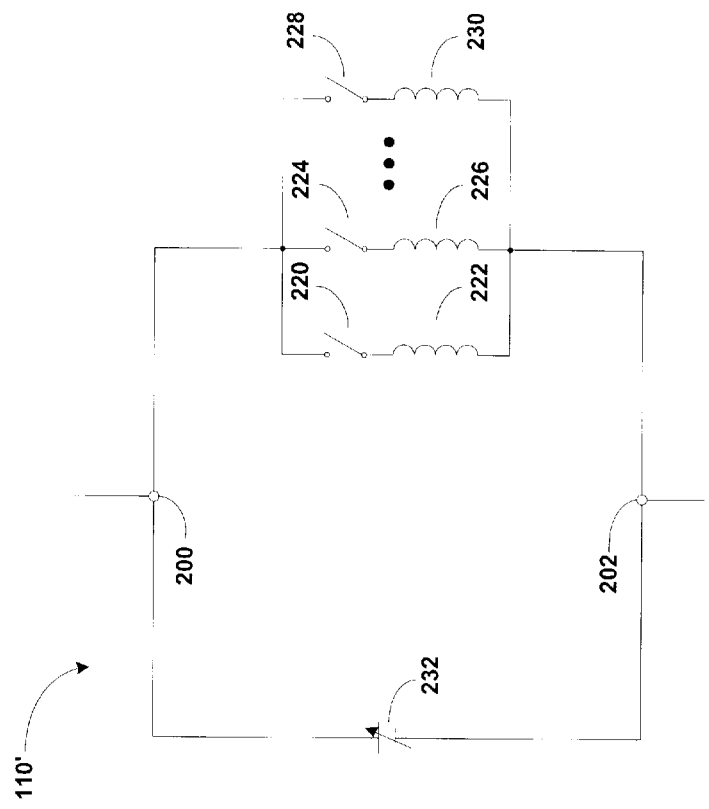
FIG. 2A is schematic diagram of a resonant LC network used in the sigma-delta modulator in accordance with an embodiment of the invention.

Referring now to FIG. 2A, the first resonant LC network 110 is illustrated. For the sake of brevity, only the first resonant LC network 110 will be described herein. It should be appreciated, however, that the second resonant LC network 118 is similar to the first resonant LC network 110. The second resonant LC network may have different component values, e.g., the capacitance and inductance of each component, from the first resonant LC network 110, or it may have the same component values as the first resonant LC network 110.

The resonant LC network 110 incorporates MEMS switches for selecting the L and C characteristics of the network 110. The MEMS switches, the inductors and the capacitors are formed on the substrate 102. A MEMS switch provides several advantages over a semiconductor switch (e.g., semiconductor transistors, pin diodes). In particular, a MEMS switch has a very low insertion loss (e.g., less than 0.2 dB at 45 GHz) and a high isolation when open (e.g., greater than 30 dB). In addition, the switch has a large frequency response and a large bandwidth compared to semiconductor transistors and pin diodes. These advantages provide enhanced performance and control when used in tunable filter designs. Additional details relating to MEMS switches can be found in U.S. Pat. No. 6,046,659, the disclosure of which is herein incorporated by reference in its entirety.

The capacitance of the resonant LC network 110 may be continuously adjusted by adding and/or removing capacitance from the circuit. In addition, the inductance of the LC network 110 may be changed by adding and/or removing inductance from the LC network. Capacitance and inductance are added and/or removed through the use of the aforementioned MEMS switches. In one embodiment, the LC network 110 includes MEMS switches for tuning both the inductance and the capacitance of the LC network. In another embodiment, the LC network 110 includes MEMS switches for tuning only the capacitance of the network.

The resonant LC network 110 includes a first terminal 200 and a second terminal 202. A first MEMS switch 204 has one end connected to the first terminal 200 and the other end connected to one end of a first capacitor 206. The other end of the first capacitor is connected to the second terminal 202. A second MEMS switch 208 has one end connected to the first terminal 200 and the other end connected to one end of a second capacitor 210. The other end of the second capacitor is connected to the second terminal 202. A third MEMS switch 212 has one end connected to the first terminal 200 and the other end connected to one end of a third capacitor 214. The other end of the third capacitor is connected to the second terminal 202.

A fourth MEMS switch 220 has one end connected to the first terminal 200 and the other end connected to one end of a first inductor 222. The other end of the first inductor is connected to the second terminal 202. A fifth MEMS switch 224 has one end connected to the first terminal 200 and the other end connected to one end of a second inductor 226. The other end of the second inductor is connected to the second terminal 202. A sixth MEMS switch 228 has one end connected to the first terminal 200 and the other end connected to one end of a third inductor 230. The other end of the third inductor is connected to the second terminal 202.

It should be appreciated that while three MEMS-capacitors and three MEMS-inductors are shown, more or fewer capacitors and/or inductors may be implemented without departing from the scope of the invention. Furthermore, it is noted that control lines to command each MEMS switch to "open" and "close" are not shown in the diagrams. These control lines, however, would be evident to one skilled in the art.

The open and close action of each MEMS switch is achieved by applying a bias voltage to one or more control terminals of the MEMS switch. For example, a single pole MEMS switch may have four terminals, two terminals for the isolated switch contact, and two terminals for a "control" connection, e.g., to command the switch to open and close. When a voltage is applied to the control terminals of the MEMS switch, an electrostatic force pulls an armature towards the substrate. If the switch is a normally open (N.O.) configuration, then the isolated switch contact will close upon the application of the voltage. Conversely, if the switch is a normally closed (N.C.) switch, then the isolated switch contact will open upon application of the voltage.

Operation of the resonant LC network 110 illustrated in FIG. 2A now will be briefly described. Initially, the first MEMS switch 204 and the fourth MEMS switch 220 are assumed to be closed, and all remaining MEMS switches are assumed to be open. In this state, the total capacitance in the network 110 is determined by the capacitance of the first capacitor 206 and the total inductance in the network 110 is determined by the inductance of the first inductor 222. Additional capacitance may be added by closing one of the open MEMS switches 208, 212. For example, if the second MEMS switch 208 is closed, the total capacitance in the resonant LC network 110 is determined by adding the capacitance of the first capacitor 206 and the capacitance of the second capacitor 210. Similarly, if the second and third MEMS switches 208, 212 are closed, the total capacitance in the circuit is determined by adding the capacitance of the first capacitor 206, the second capacitor 210 and the third capacitor 214. Capacitance may be removed by opening any of the first three MEMS switches 204, 208, 212.

In a similar fashion, the inductance of the resonant LC network 110 can be altered. The inductance may be reduced by closing one of the open MEMS switches 224, 228. For example, if the fifth MEMS switch 224 is closed, the total inductance in the resonant LC network 110 is determined by the parallel combination of the first inductor 222 and the second inductor 226. Similarly, if the fifth and sixth MEMS switches 224, 228 are closed, the total inductance in the circuit is determined by the parallel combination of the first inductor 222, the second inductor 226 and the third inductor 230.

Figure 2B:
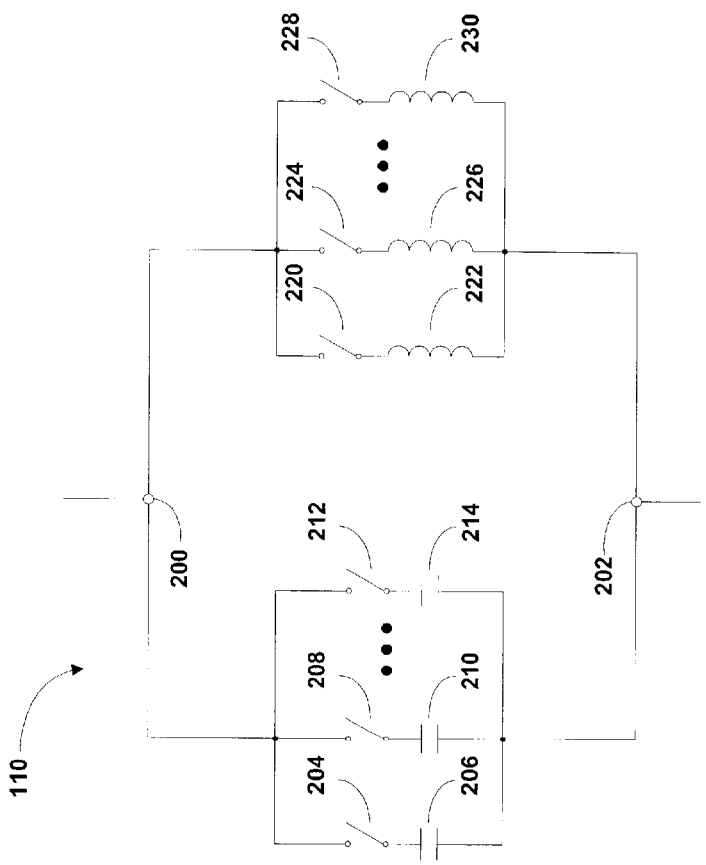
FIG. 2B is schematic diagram of a resonant LC network used in the sigma-delta modulator in accordance with another embodiment of the invention.

Referring now to FIG. 2B, an alternative embodiment of the LC network 110' is illustrated. The alternative embodiment may be used in place of the first and second LC networks 110, 118 discussed above. The LC network 110' is similar to the LC network 110 in that it includes a bank of inductors that are switched in and out of the network through MEMS switches. The bank of capacitors, however, is not present. Instead, a MEMS variable capacitor is used to provide a variable capacitance to the network 110'. A MEMS variable capacitor can provide a continuous range of capacitance within a given minimum and maximum value of capacitance.

It should be appreciated that while only one MEMS variable capacitor 232 is shown in the LC network 110', multiple MEMS variable capacitors may be implemented without departing from the scope of the invention.

A first end of the MEMS variable capacitor 232 is connected to the first terminal 200. The other end of the MEMS variable capacitor is connected to the second terminal 202. The capacitance of the MEMS variable capacitor 232 can be continuously varied by adjusting an applied analog voltage (not shown). Thus, the MEMS variable capacitor 232 allows the resonant frequency of the LC network 110' to be changed continuously, in a non-discrete manner, which allows the flexibility of frequency hopping in non-discrete steps.

As is known in the art, for every combination of L and C of an LC circuit, there only is one frequency (in both series and parallel circuits) that causes the reactance of the L component ($X_L$) to exactly equal the reactance of the C component ($X_C$). This frequency is known as the resonant frequency. When the resonant frequency is fed to a series or parallel LC circuit, $X_L$ becomes equal to $X_C$, and the circuit is said to be resonant to that frequency. For an LC network, the resonant frequency is determined by the formula $f=1/2\pi\sqrt{LC}$, where f is the resonant frequency in Hertz, L is the total inductance of the circuit in Henries, and C is the total capacitance of the circuit in Farads.

Each LC circuit responds to the resonant frequency differently than it does to any other frequency. Because of this, an LC circuit has the ability to separate frequencies. Thus, a tunable LC network can be tuned to allow a particular frequency to pass while rejecting all other frequencies. An increase in the value of either L or C, or both L and C, will lower the resonant frequency of a given circuit. A decrease in the value of L or C, or both L and C, will raise the resonant frequency of a given circuit.

From the above discussion, it will be appreciated by those skilled in the art that the center frequency of the modulator 100 may be changed, for example, by tuning the capacitance of the resonant LC networks 110, 118. Similarly, the tuning range of the modulator may be changed, for example, by tuning the inductance of the resonant LC networks 110, 118. The ability to tune the resonant LC networks permits the modulator 100 to be used in frequency hopping receiver applications, e.g., applications that transmit and receive information over a frequency that changes or "hops" from one of several frequencies. Furthermore, the use of high frequency silicon technology, e.g., SiGe, will permit direct sampling at RF. Since the modulator 100 combines a down-conversion step and a digitization step into one function by directly sampling the signal at the incoming RF frequency, one down-conversion step is eliminated in RF receiver applications.

Another benefit of the present invention is that the use of MEMS switches produce higher Q values (Q between 20 and 50 at frequency of 1–2 GHz) for the external LC components in the resonant LC networks 110, 118 than semiconductor switches. The higher Q values relax or eliminate the requirement for active Q-enhancement circuitry, thus reducing the cost, size and power requirements of the resonant LC network. Moreover, the elimination of active Q-enhancement circuitry results in a reduction in distortion and noise, both of which are an inherent component of active Q-enhancement circuitry.

The higher Q values of the resonant LC network also improve the inherent filter shape within the feedback loops 146, 146', 148, 148' of the sigma-delta modulator 100. This has the effect of reducing the distortion of active components within the feedback loops. Furthermore, on-chip (e.g., in CMOS) digital adaptive control 150 can be implemented to allow the sigma-delta modulator 100 to change center frequencies while adjusting loop parameters to maintain stability. In addition, the sigma-delta modulator 100 can take advantage of the digital enhancements to perform as a fast frequency hopping receiver. These enhancements include, for example, varying the resonant frequencies of the LC networks through the digital adaptive control 150, such that the modulator 100 acts as a frequency hopping receiver. The resonant frequency of the LC networks can be digitally adjusted, allowing the modulator to receive an RF signal that is frequency hopping, or changing frequency over time, by changing the resonant frequencies of the LC networks to accommodate reception of these hopping frequencies, at some prescribed frequency hopping rate. This allows the modulator essentially to track the incoming signal frequency shifts over time.

Figure 3:
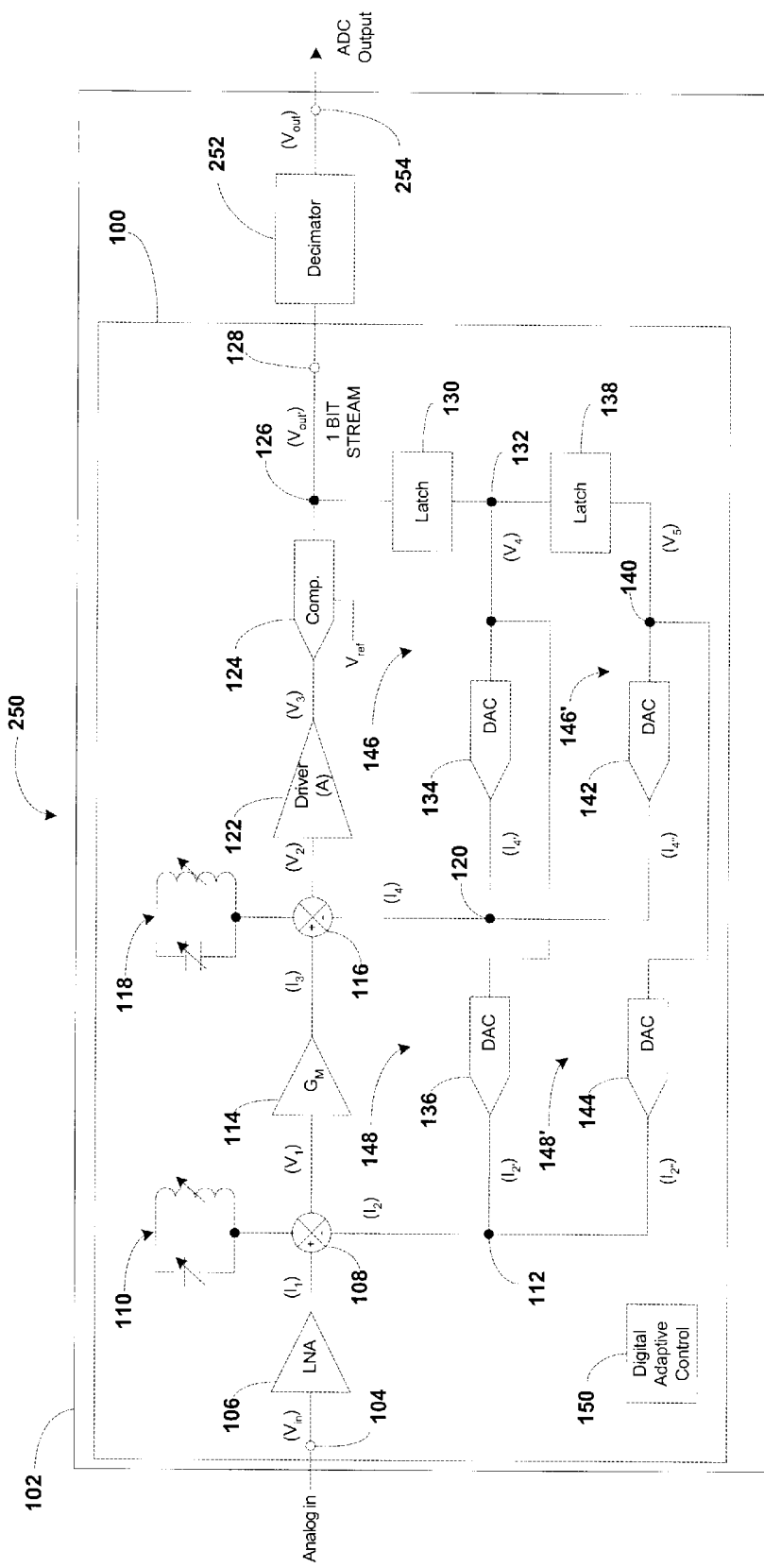
FIG. 3 is a block diagram of a sigma-delta analog-to-digital converter in accordance with an embodiment of the invention.

Referring to FIG. 3, a sigma-delta ADC 250 is illustrated. A decimator 252 is coupled to the sigma-delta modulator 100 to form a complete sigma-delta ADC 250 on a single chip. For example, using SiGe BiCMOS technology, the 1-bit output stream of the sigma-delta modulator 100 is electrically connected to an input of a digital decimator 252, which is formed on the same substrate 102 as the modulator 100. The output of the decimator 252 is electrically connected to an output terminal 254 of the sigma-delta ADC 250. The decimator 252 converts the oversampled signal from the sigma-delta modulator 100 into an output signal at the Nyquist frequency. Decimators are well know in the art and will not be discussed herein.

The co-integration of the decimator 252 with the sigma-delta modulator 100 will minimize the number of chip-to-chip interconnects required, as well as reduce the power loss associated with chip-to-chip interconnects. The transfer of digital data from the sigma-delta modulator 100 to the decimator 252 can occur at maximum clock rate, e.g., 100% of the clock rate, with low power consumption.

While particular embodiments of the invention have been described in detail, it is understood that the invention is not limited correspondingly in scope, but includes all changes, modifications and equivalents coming within the spirit and terms of the claims appended hereto.

What is claimed is:

1. A sigma-delta modulator, comprising:
   a substrate;
   at least one transconductance amplifier on the substrate;
   at least one digital-to-analog converter (DAC) on the substrate;
   a plurality of micro electro mechanical system (MEMS) switches on the substrate; and
   at least one LC network on the substrate, wherein a center frequency of the sigma-delta modulator is modified using at least one of the plurality MEMS switches.

2. The device of claim 1, wherein the at least one LC network includes a plurality of capacitors, and the center frequency of the modulator is modified by adding and removing at least one of the plurality of capacitors from the LC network using at least one of the plurality of MEMS switches.

3. The device of claim 2, wherein the at least one LC network includes a plurality of inductors, and a tuning range of the modulator is modified by adding and removing at least one of the plurality of inductors from the LC network using at least one of the plurality of MEMS switches.

4. The device of claim 1, wherein the at least one transconductance amplifier and the at least one DAC are implemented using BiCMOS technology.

5. The device of claim 1, further comprising a digital adaptive control system.

6. The device of claim 5, wherein the digital adaptive control system adjusts at least one loop parameter to maintain stability of the sigma-delta modulator.

7. The device of claim 5, wherein the digital adaptive control system adjusts the center frequency of the modulator.

8. The device of claim 7, wherein the center frequency is adjusted to hop from one of a plurality of frequencies.

9. The device of claim 1, wherein the sigma-delta modulator performs direct sampling at radio frequencies.

10. The device of claim 1, further comprising a low noise amplifier (LNA), a driver amplifier, a comparator, and at least one latch.

11. The device of claim 10, wherein the sigma-delta modulator is implemented using a differential architecture.

12. The device of claim 1, wherein the modulator is a fourth order modulator.

13. The device of claim 1, further comprising a decimator on the substrate, wherein the decimator is operatively coupled to an output of the sigma delta modulator.

14. The device of claim 13, where a transfer of data between the sigma-delta modulator and the decimator occurs at maximum clock rate.

15. A sigma-delta modulator, comprising:
    a substrate;
    at least one transconductance amplifier on the substrate;
    at least one digital-to-analog converter (DAC) on the substrate; and
    at least one LC network on the substrate, wherein the LC network includes at least one MEMS variable capacitor, and a center frequency of the sigma-delta modulator is modified by varying the capacitance of the at least one MEMS variable capacitor.

16. The device of claim 15, further comprising a plurality of MEMS switches on the substrate, wherein the at least one LC network includes a plurality of inductors, and a tuning range of the modulator is modified by adding and removing at least one of the plurality of inductors from the LC network using at least one of the plurality of MEMS switches.

17. The device of claim 15, wherein the at least one transconductance amplifier and the at least one DAC are implemented using BiCMOS technology.

18. The device of claim 15, further comprising a digital adaptive control system implemented in CMOS.

19. The device of claim 18, wherein the digital adaptive control system adjusts at least one loop parameter to maintain stability of the sigma-delta modulator.

20. The device of claim 18, wherein the digital adaptive control system adjusts the center frequency of the modulator.

21. The device of claim 20, wherein the center frequency is adjusted to hop from one of a plurality of frequencies.

22. The device of claim 15, wherein the sigma-delta modulator performs direct sampling at radio frequencies.

23. The device of claim 15, further comprising a low noise amplifier (LNA), a driver amplifier, a comparator, and at least one latch.

24. The device of claim 23, wherein the sigma-delta modulator is implemented using a differential architecture.

25. The device of claim 15, wherein the modulator is a fourth order modulator.

26. The device of claim 15, further comprising a decimator on the substrate, wherein the decimator is operatively coupled to an output of the sigma delta modulator.

27. The device of claim 26, where a transfer of data between the sigma-delta modulator and the decimator occurs at maximum clock rate.

* * * * *